(12) United States Patent
Rastegar

(10) Patent No.: US 8,888,086 B2
(45) Date of Patent: Nov. 18, 2014

(54) APPARATUS WITH SURFACE PROTECTOR TO INHIBIT CONTAMINATION

(75) Inventor: Abbas Rastegar, Schenectady, NY (US)

(73) Assignee: Sematech, Inc., Albany, NY (US)

( * ) Notice: Subject to any disclaimer, the term of this patent is extended or adjusted under 35 U.S.C. 154(b) by 215 days.

(21) Appl. No.: 13/105,148

(22) Filed: May 11, 2011

(65) Prior Publication Data

US 2012/0286463 A1 Nov. 15, 2012

(51) Int. Cl.
| | |
|---|---|
| *B23Q 3/00* | (2006.01) |
| *G03F 7/20* | (2006.01) |
| *G03F 1/68* | (2012.01) |
| *G03F 1/66* | (2012.01) |
| *H01L 21/67* | (2006.01) |

(52) U.S. Cl.
CPC .............. *G03F 1/66* (2013.01); *G03F 7/70916* (2013.01); *G03F 1/68* (2013.01); *G03F 7/70841* (2013.01); *H01L 21/6719* (2013.01); *Y10S 269/903* (2013.01)
USPC ........... 269/289 R; 269/903; 269/55; 206/710

(58) Field of Classification Search
CPC ............................................ H01L 2924/30105
USPC ..................... 269/289 R, 903, 21, 20, 55, 60; 206/710–712, 723, 722; 355/74
See application file for complete search history.

(56) References Cited

U.S. PATENT DOCUMENTS

| | | | |
|---|---|---|---|
| 5,025,926 A * | 6/1991 | Gregerson et al. ............ 206/711 |
| 5,296,893 A * | 3/1994 | Shaw et al. ..................... 355/75 |
| 5,314,068 A * | 5/1994 | Nakazato et al. .............. 206/454 |
| 5,611,452 A * | 3/1997 | Bonora et al. ................. 220/378 |
| 5,673,167 A * | 9/1997 | Davenport et al. ........... 361/234 |
| 5,871,587 A * | 2/1999 | Hasegawa et al. ............ 118/719 |
| 6,174,370 B1 * | 1/2001 | Yoshida ......................... 118/500 |
| 6,197,246 B1 * | 3/2001 | Niori et al. ..................... 264/618 |
| 6,646,689 B2 * | 11/2003 | Matsuda ............................ 349/1 |
| 7,446,284 B2 * | 11/2008 | Fan et al. .................... 219/444.1 |
| 7,497,913 B2 | 3/2009 | Rastegar et al. |
| 7,601,972 B2 * | 10/2009 | Nakasuji et al. ......... 250/441.11 |
| 7,629,556 B2 | 12/2009 | Rastegar |
| 7,921,859 B2 | 4/2011 | Rastegar et al. |

(Continued)

OTHER PUBLICATIONS

A.S. Geller et al., "Improved Reticle Carrier Design Through Numerical Simulation", Sandia National Laboratories, EUV Mask Standards Workshop, San Jose, CA (Feb. 28, 2005).

(Continued)

*Primary Examiner* — Lee D Wilson
*Assistant Examiner* — Henry Hong
(74) *Attorney, Agent, or Firm* — Kevin P. Radigan, Esq.; Heslin Rothenberg Farley & Mesiti P.C.

(57) ABSTRACT

An apparatus is provided for protecting a surface of interest from particle contamination, and particularly, during transitioning of the surface between atmospheric pressure and vacuum. The apparatus includes a chamber configured to receive the surface, and a protector plate configured to reside within the chamber with the surface, and inhibit particle contamination of the surface. A support mechanism is also provided suspending the protector plate away from an inner surface of the chamber. The support mechanism holds the protector plate within the chamber in spaced, opposing relation to the surface to provide a gap between the protector plate and the surface which presents a diffusion barrier to particle migration into the gap and onto the surface, thereby inhibiting particle contamination of the surface.

5 Claims, 12 Drawing Sheets

(56) References Cited

U.S. PATENT DOCUMENTS

| | | | |
|---|---|---|---|
| 8,446,570 B2* | 5/2013 | Del Puerto et al. | 355/75 |
| 2003/0047202 A1* | 3/2003 | Worm | 134/157 |
| 2003/0227605 A1* | 12/2003 | del Puerto et al. | 355/51 |
| 2005/0236942 A1* | 10/2005 | Rival et al. | 312/236 |
| 2006/0207629 A1 | 9/2006 | Rastegar et al. | |
| 2006/0213615 A1 | 9/2006 | Rastegar | |
| 2006/0260662 A1 | 11/2006 | Rastegar et al. | |
| 2007/0002516 A1* | 1/2007 | Matsumoto | 361/234 |
| 2007/0163715 A1 | 7/2007 | Rastegar | |
| 2007/0211232 A1* | 9/2007 | Phillips et al. | 355/30 |
| 2008/0264446 A1 | 10/2008 | Rastegar et al. | |
| 2008/0302390 A1 | 12/2008 | Rastegar | |
| 2009/0038988 A1* | 2/2009 | Lin et al. | 206/723 |
| 2009/0301917 A1* | 12/2009 | Kolbow et al. | 206/454 |
| 2011/0109029 A1* | 5/2011 | Takeda et al. | 269/8 |

OTHER PUBLICATIONS

J.R. Torczynski et al., "Particle-Contamination Analysis for Reticles in Carrier Inner Pods", Proc. of SPIE, Vole. 6921, 69213G-1 (2008).

M. Yonekawa et al., "Evaluation of Transfer of Particles from Dual-Pod Base Plate to EUV Mask", Proc. of SPIE, vol. 7748, 774820-1 (2010).

K. Ota et al. "Study of Electrification of Extreme Ultraviolet Lithography Mask and Adhesion of Particles During Electrostatic Chucking", J. Micro/Nanolith, MEMS MOEMS, vol. 10, No. 1 (Jan.-Mar. 2011).

K. Ota et al., "Evaluation Results of a New EUV Reticle Pod Having Reticle Grounding Paths", Proc. of SPIE, vol. 7969, 79691V-1 (2011).

* cited by examiner

APPARATUS WITH SURFACE PROTECTOR TO INHIBIT CONTAMINATION

BACKGROUND

This invention relates generally to semiconductor fabrication, and more particularly, to inhibiting particle contamination of a surface, such as a surface of a reticle, a mask, a mask blank, a wafer, a substrate, a glass plate, etc.

The electronics industry continues to rely on advances in semiconductor technology to realize ever higher-functioning devices in more compact areas. For many applications, realizing higher-function devices requires integrating a larger and larger number of electronic devices into a single wafer. As the number of electronic devices per area of wafer increases, the manufacturing processes become more intricate.

One of the process steps encountered in the fabrication of integrated circuits and other semiconductor devices is photolithography. Generally stated, photolithography includes selectively exposing a specially-prepared wafer surface to a source of radiation using a patterned template to create an etched surface layer. Typically, the patterned template is a reticle, which is a flat, glass plate that contains the patterns to be reproduced on the wafer.

The industry trend towards the production of integrated circuits that are smaller and/or with higher logic density necessitates ever smaller line widths. The resolution with which a pattern can be reproduced on the wafer surface depends, in part, on the wavelength of ultraviolet light used to project the pattern onto the surface of the photoresist-coated wafer. State-of-art photolithography tools use deep, ultraviolet light, with wavelengths of 193 nm, which allow minimum feature sizes on the order of 100 nm. Tools currently being developed use 157 nm extreme ultraviolet (EUV) light to permit resolution of features at sizes below 70 nm.

Extreme ultraviolet lithography (EUVL) is a significant departure from the deep, ultraviolet lithography currently in use today. All matter absorbs EUV radiation, and hence, EUV lithography takes place in a vacuum. The optical elements, including the photo-mask, make use of defect-free multi-layers, which act to reflect light by means of interlayer interference. With EUV, reflection from the patterned surface is used as opposed to transmission through the reticle characteristic of deep, ultraviolet light photolithography. The reflective photo-mask (reticle) employed in EUV photolithography is susceptible to contamination and damage to a greater degree than reticles used in conventional photolithography. This imposes heightened requirements on reticle handling destined for EUV photolithography use. For example, any particle contamination of the surface of the reticle could compromise the reticle to a degree sufficient to seriously affect the end product obtained from the use of such a reticle during processing. The problem is particularly significant in, for example, a transfer chamber, such as a load-lock structure, where changing pressure between atmospheric and vacuum creates turbulence within the chamber, and thus increased likelihood of contamination.

BRIEF SUMMARY

In one aspect, the shortcomings of the prior art are overcome and additional advantages are provided through the provision of an apparatus for inhibiting particle contamination of a surface. The apparatus, which is for a chamber configured to receive the surface to be protected, includes a protector plate and a support mechanism. The protector plate is configured to reside within the chamber with the surface to be protected, and inhibit particle contamination of the surface. The support mechanism suspends the protector plate within the chamber, and holds the protector plate within the chamber in spaced, opposing relation to the surface to be protected to provide a gap between the protector plate and surface, which presents a diffusion barrier to particle migration into the gap and onto the surface, thereby inhibiting particle contamination of the surface.

In another aspect, an apparatus is provided for inhibiting particle contamination of a surface. The apparatus includes a protector frame configured to receive the surface to be protected. The protector frame comprises an open-ended frame structure having a first open end and a second open end at opposite sides of the protector frame to facilitate insertion of the surface within or removal of the surface from the protector frame. The protector frame further includes a protector plate configured to inhibit particle contamination of the surface with the surface disposed within the protector frame, and at least one first support, and at least one second support. The at least one first support and the at least one second support reside on opposite sides of the protector frame, and are configured to support the surface within the protector frame with the surface in spaced, opposing relation to the protector plate, and provide a gap between the protector plate and the surface which presents a diffusion barrier to particle migration into the gap and onto the surface, thereby inhibiting particle contamination of the surface.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
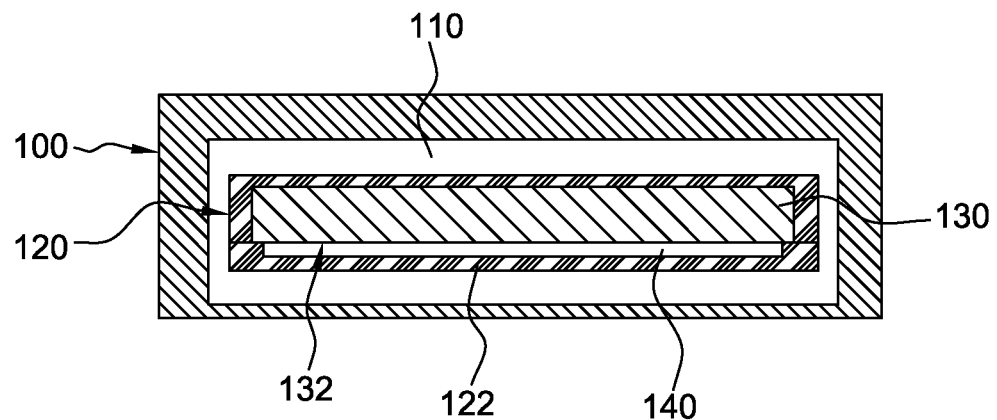
FIG. 1 is a cross-sectional view of one embodiment of a dual-container approach to inhibiting particle contamination of a surface.

The present invention and various aspects and advantageous of the invention are explained more fully with reference to the non-limiting embodiments illustrated in the accompanying drawings. Descriptions of well-known starting materials, processing techniques, components and equipment are omitted so as not to unnecessarily obscure the invention in detail. It should be understood, however, that the detailed description and examples presented, while indicating embodiments of the invention, are given by way of illustration only and not by way of limitation. Various substitutions, modifications, additions, and/or rearrangements within the spirit and/or scope of the underlying inventive concept will be apparent to those skilled in the art from this disclosure.

As noted, the reflective photo-mask (reticle) employed in EUV photolithography is susceptible to contamination and damage to a greater degree than reticles used in conventional photolithography. This imposes heightened requirements on reticle handling destined for EUV photolithography use. For example, any particle contamination of the surface of interest of a reticle could compromise the reticle to a degree sufficient to seriously affect the end product obtained from the use of such a reticle during processing. The problem is particularly significant in, for example, a transfer chamber, such as a load-lock structure, where changing pressure between atmospheric and vacuum creates turbulence within the chamber, and thus increased likelihood of contamination of the surface of interest of the reticle.

Note that as used herein, the "surface of interest" and "surface to be protected" are used interchangeably. Further, note that the surface of interest is described below as being a surface of a process structure. Generally stated, a "process structure" is used herein to mean any of a variety of structures, including a reticle, a mask, a mask blank, a wafer, a substrate, or a plate, such as a glass plate, etc.

The present disclosure provides various apparatuses for protecting a surface of interest by inhibiting particle contamination of the surface, for example, within a transfer chamber of a processing environment. In one aspect, an apparatus is provided for a chamber to receive a surface to be protected. The apparatus includes a protector plate configured to reside within the chamber with the surface, and a support mechanism which suspends the protector plate within the chamber and holds the protector plate within the chamber in spaced, opposing relation to the surface to define a gap between the protector plate and the surface which presents a diffusion barrier to particle migration into the gap and onto the surface, thereby inhibiting particle contamination of the surface.

In another embodiment, an apparatus is provided which includes a protector frame configured to receive a surface to be protected. The protector frame is an open-ended frame structure having a first open end and a second open end at opposite sides of the protector frame to facilitate insertion of the surface within or removal of the surface from the protector frame which might be disposed, for example, within a transfer chamber of a processing environment. The protector frame includes a protector plate configured to inhibit particle contamination of the surface with the surface disposed within the protector frame, and one or more first and second supports which support the surface within the protector frame with the surface in spaced, opposing relation to the protector plate, and provide a gap between the protector plate and the surface which presents a diffusion barrier to particle migration into the gap and onto the surface, thereby inhibiting particle contamination of the surface.

Reference is made below to the drawings, which are not drawn to scale for reasons of understanding, wherein the same reference numbers used throughout different figures designate the same or similar components.

FIG. 1 depicts one approach for protecting a surface of interest 132 of a process structure 130. In this embodiment, referred to as a dual-container structure (or dual-pod structure), an outer container 100 is provided configured and sized to receive an inner container 120. Inner container 120 is sized to receive process structure 130 comprising surface of interest 132. As illustrated in FIG. 1, in the dual-container implementation, the surface of interest 132 is inverted to be in spaced, opposing relation with a base 122 of inner container 120 to define a gap 140 between the surface 132 and base 122 in a manner which provides minimal contact between the surface of interest and the inner container 120. Gap 140 further presents a diffusion barrier that mitigates against particles settling on the surface of interest 132. Base 122 of inner container 120 is a flat, polished surface with protrusions upon which the surface of interest rests.

One disadvantage of this dual-container approach, however, is that significant tool modifications are required for integrating the dual-container structure into a conventional processing environment. These tool modifications are typically complex and costly. In comparison, the apparatuses disclosed hereinbelow advantageously protect the surface of interest (for example, within a transfer chamber), without requiring any significant modifications to the tools of the processing environment.

Figure 2:
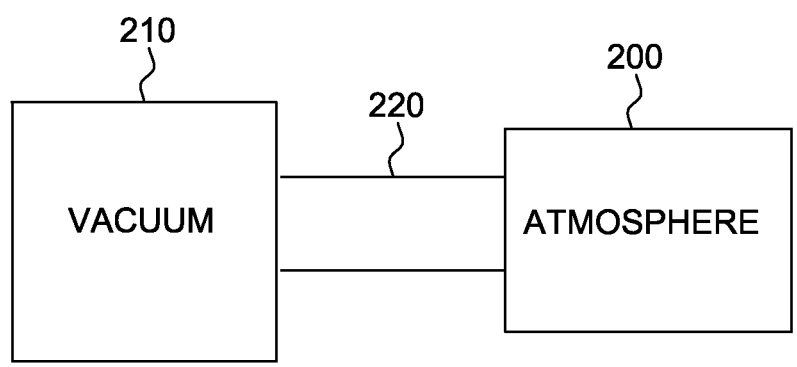
FIG. 2 depicts a processing environment comprising an atmospheric stage, a vacuum stage, and a transfer chamber facilitating transitioning a process structure between the atmospheric stage and the vacuum stage during which a surface is to be protected, in accordance with one or more aspects of the present invention.

FIG. 2 illustrates one embodiment of a processing environment comprising an atmospheric processing stage 200 and a vacuum processing stage 210, and a transfer chamber 220, such as a load-lock structure, provided between the stages. The transfer chamber 220 facilitates transitioning of a process structure between, for example, the atmospheric stage and the vacuum stage.

Figure 3:
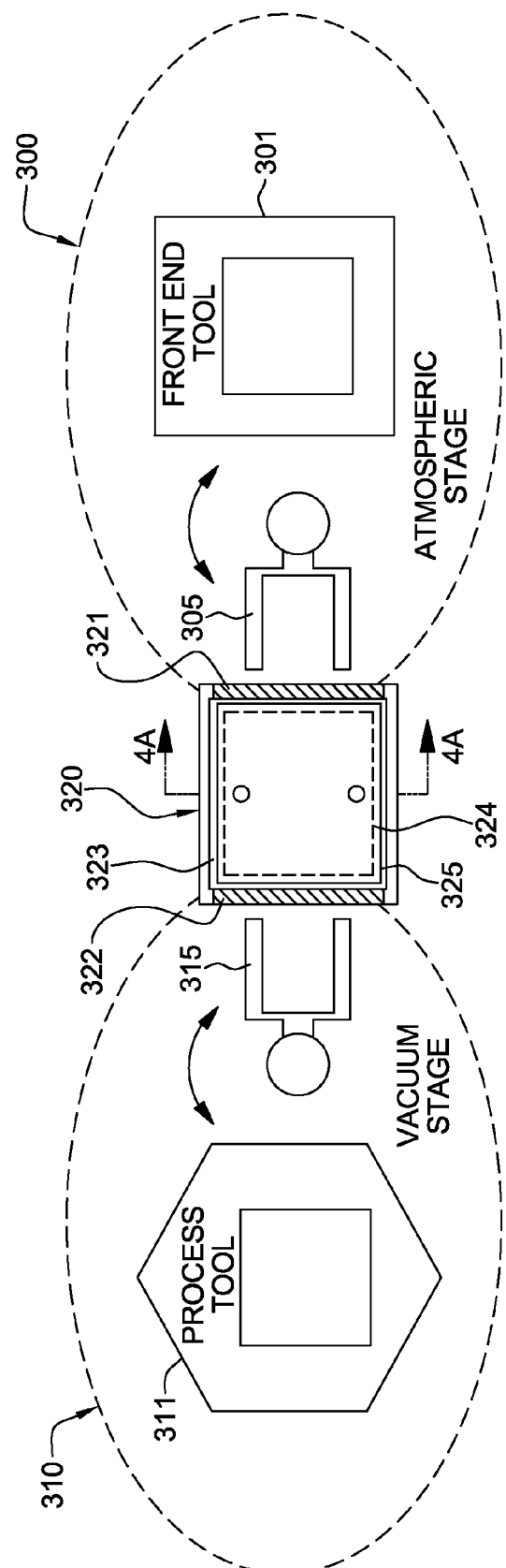
FIG. 3 depicts a more detailed embodiment of a processing environment comprising a transfer chamber coupled between an atmospheric stage and a vacuum stage, wherein the transfer chamber facilitates transitioning between the atmospheric stage and the vacuum stage, and during which a surface of interest is to be protected from particle contamination, in accordance with one or more aspects of the present invention.

FIG. 3 illustrates in more detail one embodiment of a processing environment comprising an atmospheric stage 300, with a front end tool 301, and a vacuum stage 310, with a process tool 311. Transfer of a process structure between the atmospheric and vacuum stages is facilitated by, in this example, a first automated end-effector 305 at the atmospheric stage 300, and a second automated end-effector 315 at the vacuum stage 310.

A transfer chamber 320 is shown disposed between atmospheric stage 300 and vacuum stage 310. This transfer chamber 320 includes a first gate 321, which opens the transfer chamber to the atmospheric stage 300, and a second gate 322, which opens the transfer chamber to the vacuum stage 310. Transfer chamber 320 includes a compartment 323 configured to receive a process structure 324, as well as a protector plate 325 for protecting a surface of interest of the process structure from contamination, as explained further below.

Figure 4A:
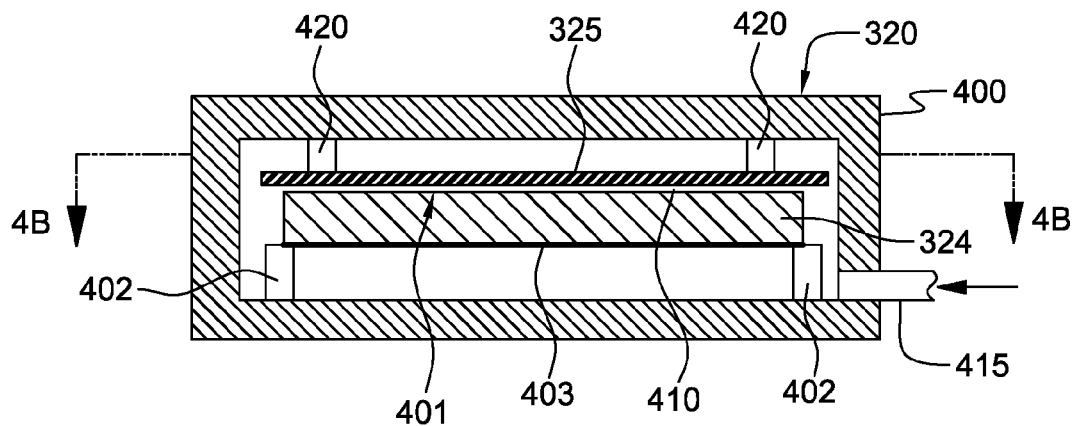
FIG. 4A is a cross-sectional elevational view of one embodiment of the transfer chamber of FIG. 3, taken along line 4A-4A thereof, and illustrating a protection plate in spaced, opposing relation to a surface of interest of a process structure, in accordance with one or more aspects of the present invention.

FIG. 4A is a cross-sectional elevational view of one embodiment of transfer chamber 320 of FIG. 3. In the embodiment illustrated, transfer chamber 320 comprises an outer (sealed) housing 400, within which a surface of interest 401 of process structure 324 is disposed, for example, by resting the process structure on one or more support members 402 within the chamber. As illustrated, process structure 324 includes a support surface 403, which is an opposite side of process structure 324 from the surface of interest 401. In one specific embodiment, support surface 403 may comprise a metallic layer chosen to minimize particulate formation with insertion of the process structure onto support members 402 or removal of the process structure from the support members, when withdrawing the process structure from the transfer chamber. Advantageously, from a handling standpoint, maintaining surface of interest 401 facing upwards within the transfer chamber means that less transfer steps are required to move the process structure between, for example, the atmospheric stage and vacuum stage of the processing environment; that is, there is no need to flip the process structure during transfer between the stages.

As noted, protector plate 325 also resides within transfer chamber 320, and is configured to protect the surface of interest by inhibiting particle contamination of the surface. In one embodiment, protector plate 325 is a solid plate, such as a metal or quartz plate. Support mechanisms 420 are provided to (for example) suspend protector plate 325 within transfer chamber 320 from one or more surfaces or walls of the housing 400 of the transfer chamber 320. In the embodiment illustrated, support mechanisms 420 suspend protector plate 325 from an upper wall of housing 400. The configuration and size of support mechanisms 420, and support members 403, are chosen (in part) with reference to thickness of the process structure, thickness of the protector plate 325, and a desired critical distance for the gap 410 between protector plate 325 and surface 401 of interest. Support mechanisms 420 hold the protector plate within the chamber in spaced, opposing relation to surface 401 to provide gap 410 with a critical distance that presents a diffusion barrier to particle migration into the gap and onto the surface, thereby inhibiting particle contamination of the surface, notwithstanding turbulence within the transfer chamber due to transitioning of the process structure between atmospheric stage and vacuum stage. One or more controllable ports 415 are provided in process chamber 320 to facilitate transitioning between atmospheric pressure and vacuum in a manner understood by one skilled in the art.

Note that as used herein, "suspended" means that the support mechanism holds the protector plate away from an inner surface or wall of the chamber to which the holding mechanism attaches. That is, the protector plate is disposed in a central region of the chamber, spaced away from the inner surface(s) or wall(s) of the chamber, which facilitates flow of turbulence within the chamber (for example, due to transitioning between atmospheric pressure and vacuum) around the protector plate and process structure. Note that in an alternate embodiment, the protector plate could be suspended within the chamber via a support mechanism which attaches the protector plate to one or more side walls of the chamber or which comprises one or more pedestals upon which the protector plate rests. Further, in alternate embodiments, if desired, the process structure can be inverted within the chamber such that the surface of interest faces downwards when in opposing relation with the protector plate, to provide the gap between the protector plate and the surface which presents the diffusion barrier to particle migration into the gap and onto the surface. Each of these variations is considered to be within the scope of the invention, as defined by the accompanying claims.

Figure 4B:
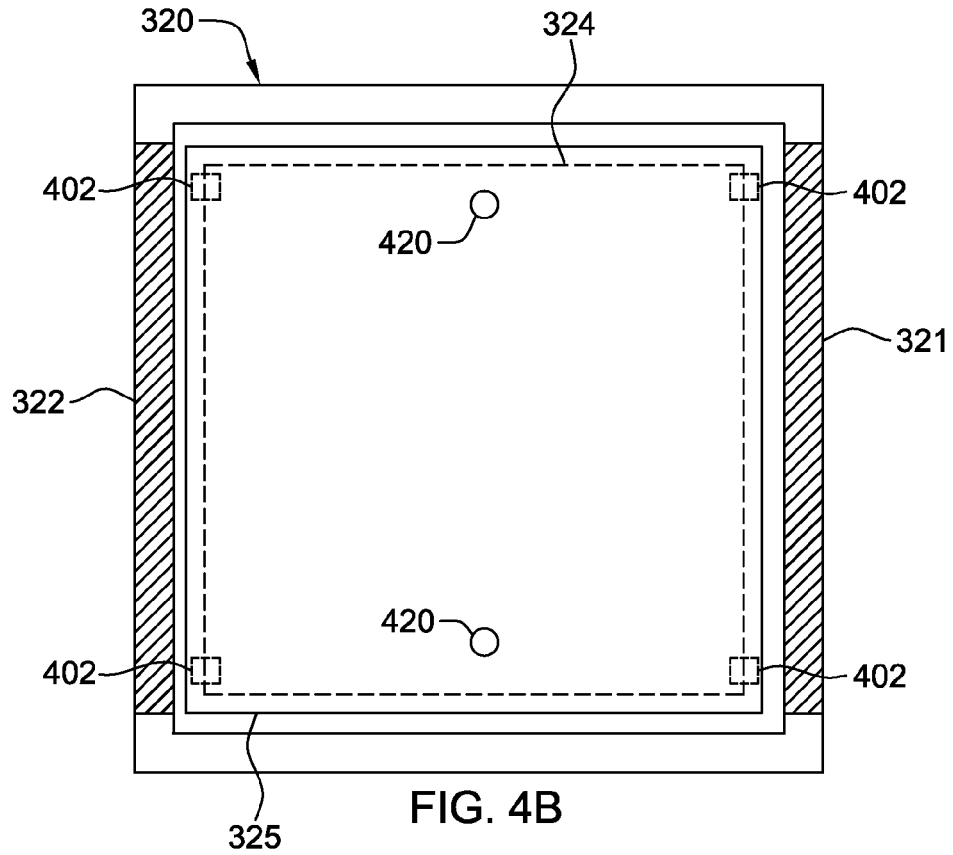
FIG. 4B is a cross-sectional plan view of the transfer chamber of FIG. 4A, taken along line 4B-4B thereof, in accordance with one or more aspects of the present invention.

FIG. 4B is a cross-sectional plan view of transfer chamber 320 of FIG. 4A. As illustrated, protector plate 325 has (in this embodiment) a larger surface area than the surface 401 of interest, extending beyond the periphery of surface of interest. Also illustrated (by way of example) are support members 402 disposed at the four corners of process structure 324 comprising surface 401 of interest. Note that although illustrated as a square-shaped process structure, it will be apparent to one of ordinary skill in the art that process structures of any shape are within the scope of the present invention. For example, the process structure may be, but without limitation, a polygonal, a circular or rectangular-shaped process structure.

Figure 5C:
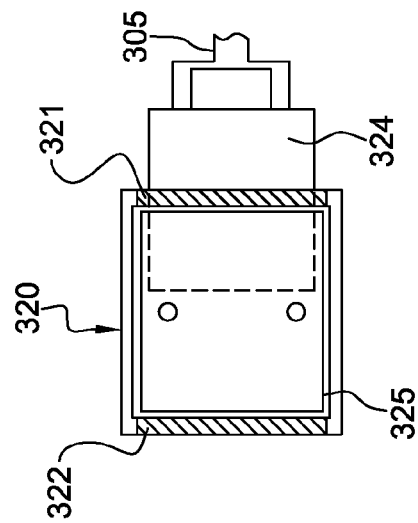
FIG. 5C is a plan view of the transfer chamber of FIGS. 5A & 5B, and illustrating unloading of the process structure, for example, at the vacuum stage of the processing environment, in accordance with one or more aspects of the present invention.
Figure 5B:
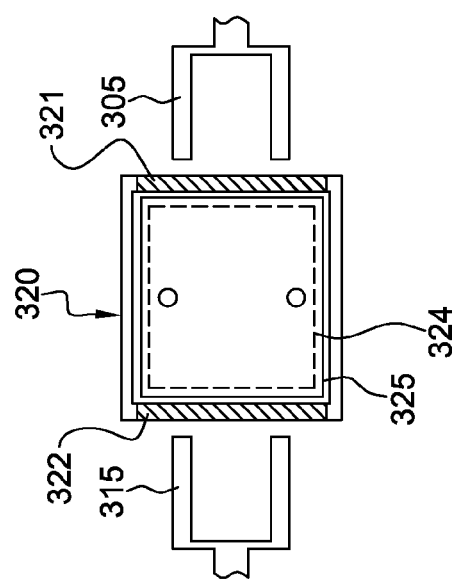
FIG. 5B illustrates the transfer chamber of FIG. 5A, with the process structure loaded into position and pressure being changed within the transfer chamber between atmospheric and vacuum, in accordance with one or more aspects of the present invention.
Figure 5A:
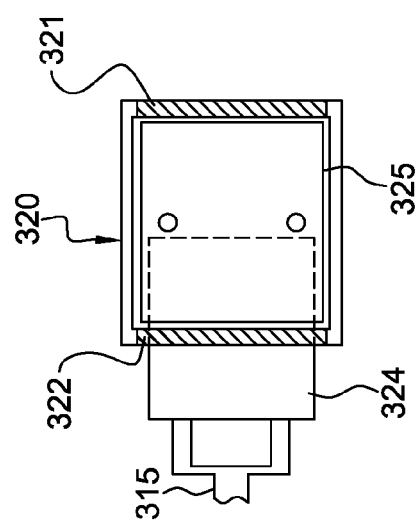
FIG. 5A is a cross-sectional plan view of the transfer chamber of FIG. 4B, and illustrating loading of a process structure into the transfer chamber in spaced, opposing relation to the protector plate, in accordance with one or more aspects of the present invention.

FIGS. 5A-5C illustrate one embodiment of a process for transitioning process structure 324 from atmospheric stage to vacuum stage employing transfer chamber 320. Referring to FIG. 5A, process structure 324 is loaded into the chamber by a first end-effector (or chuck) 305, which (in this embodiment) engages the support surface 403 (FIG. 4A) on the underside of process structure 324, opposite to the surface of interest. Process structure 324 is loaded through gate 321 into transfer chamber 320 below protector plate 325 to a position below protector plate 325, as illustrated in FIG. 5B, and described above in connection with FIGS. 3-4B. When positioned within the transfer chamber, the surface of interest is in spaced, opposing relation to the protector plate, with a gap being defined between the protector plate and the surface of interest which presents a diffusion barrier between the protector plate and the surface of interest. This diffusion barrier is sized to inhibit or present a barrier to diffusive flow of particles into the space between the protector plate and the surface of interest, thereby causing the particles to take alternative paths away from the surface of interest. This redirection is further facilitated by sizing the protector plate with a surface area larger than the surface area of the surface 401 of interest so as to extend beyond the periphery of the surface of interest, as illustrated (for example) in FIG. 5B. Once the process structure with the surface of interest is spaced in opposing relation to the protector plate, pressure within the process chamber is changed by reducing or increasing the pressure, depending on the direction of transfer of the process structure between the atmospheric stage and vacuum stage. In the example depicted, it is assumed that the process structure is being transferred from atmospheric stage to vacuum stage, and thus, as illustrated in FIG. 5C, the process structure is removed through second gate 322 of transfer chamber 320 into the vacuum stage using second end-effector (or chuck) 315.

Advantageously, by employing the apparatus described above in connection with FIGS. 3-5C, the surface of interest is protected within the transfer chamber during changing of pressure between the process stages, and this protection is achieved without complex modification to existing processing tools, as would be required using a dual-container approach such as depicted in FIG. 1.

FIGS. 6A-12B depict various enhancements to the apparatus described above in connection with FIGS. 3-5C.

Figure 6A:
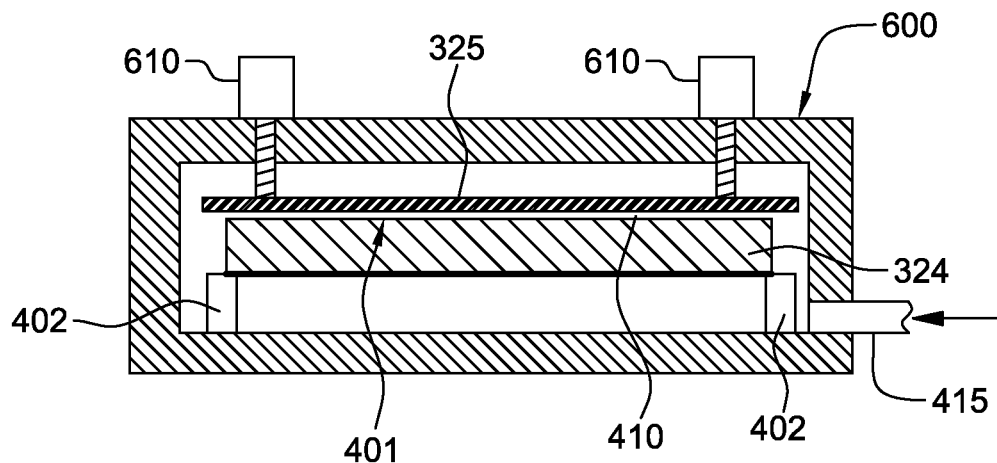
FIG. 6A is a cross-sectional elevational view of an alternate embodiment of an apparatus comprising a protector plate in spaced, opposing relation to a surface of interest of a process structure, in accordance with one or more aspects of the present invention.
Figure 6B:
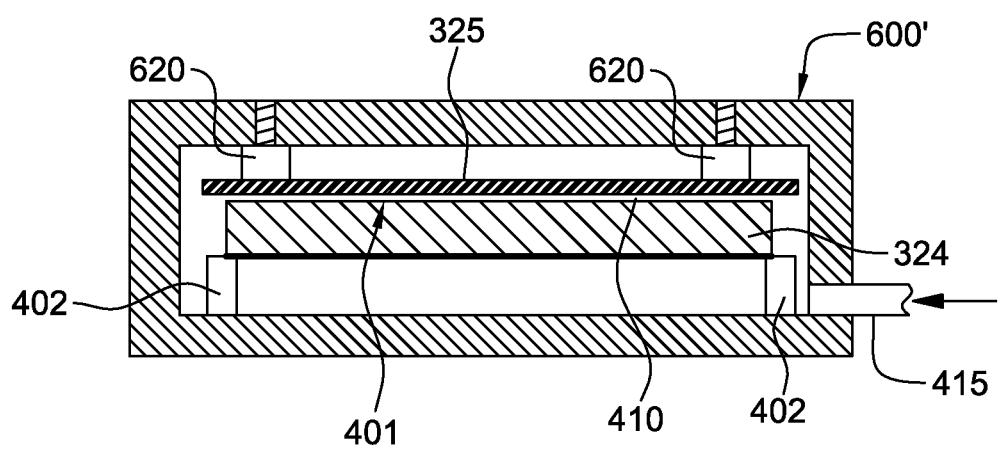
FIG. 6B is a cross-sectional elevational view of another embodiment of an apparatus comprising a protector plate in spaced, opposing relation to a surface of interest of a process structure, in accordance with one or more aspects of the present invention.

In FIGS. 6A & 6B, alternative support mechanisms are illustrated. In particular, in FIG. 6A, the fixed support mechanisms 420 of FIG. 4A are replaced with dynamically adjustable support mechanisms 600, such as a motor-driven support screw, which allows for fine adjustment to the positioning of protector plate 325 within process chamber 320. This would allow, for example, for different process structures with different thicknesses to be accommodated within the transfer chamber without manually gaining access to the transfer chamber to adjust the height or position of protector plate 325 for a particular critical distance to be achieved between the protector plate and the surface of interest. FIG. 6B depicts an alternate embodiment for a dynamically adjustable support mechanism 610, such as a piezo-electric-driven actuator. As noted, the dynamically controllable support mechanisms 600, 610 of FIGS. 6A & 6B facilitate control of the gap, that is, the critical distance between the surface of interest and the protector plate, to achieve a desired diffusion barrier which inhibits particle migration into the gap and onto the surface of interest during changing pressure within the transfer chamber.

Figure 7A:
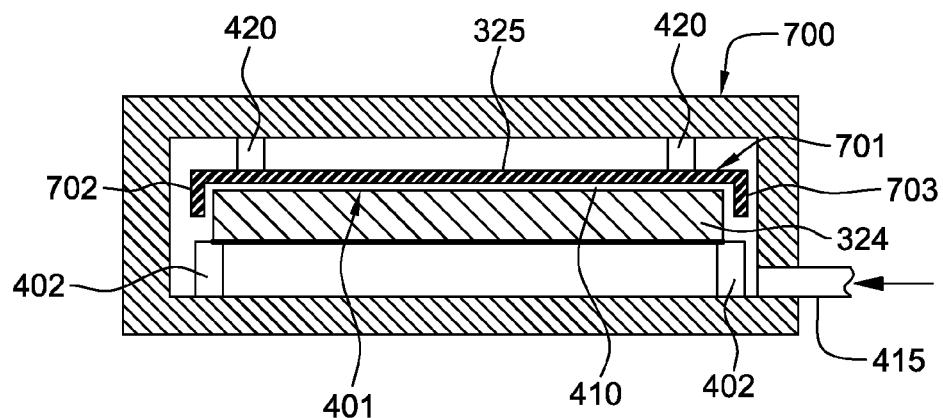
FIG. 7A is a cross-sectional view of an apparatus comprising an alternate embodiment of a protector plate in spaced, opposing relation to a surface of interest of a process structure, in accordance with one or more aspects of the present invention.

FIG. 7A depicts an alternate embodiment of the apparatus, wherein a protector frame 700 is provided comprising a protector plate 701 and a first protector side wall 702 and second protector side wall 703, extending from protector plate 701 at opposite sides of the protector plate 701. Protector frame 700 remains open at a first end and a second end (adjacent to the first gate and second gate of the transfer chamber illustrated above in connection with FIGS. 3-5C) to facilitate insertion and removal of the process structure 324. As in the embodiments described above, the protector plate is configured to inhibit particle contamination of the surface, with the surface disposed within the chamber in spaced, opposing relation to the protector plate. The protector plate provides a gap between the protector plate and the surface, which presents a diffusion barrier to particle migration into the gap and onto the surface, thereby inhibiting particle contamination of the surface. First protector side wall 702 and second protector side wall 703 further inhibit particle migration into the gap between protector plate 701 and the surface 401 of interest of process structure 324, notwithstanding turbulence in the transfer chamber due to a changing pressure, for example, between atmospheric pressure and vacuum.

Figure 7B:
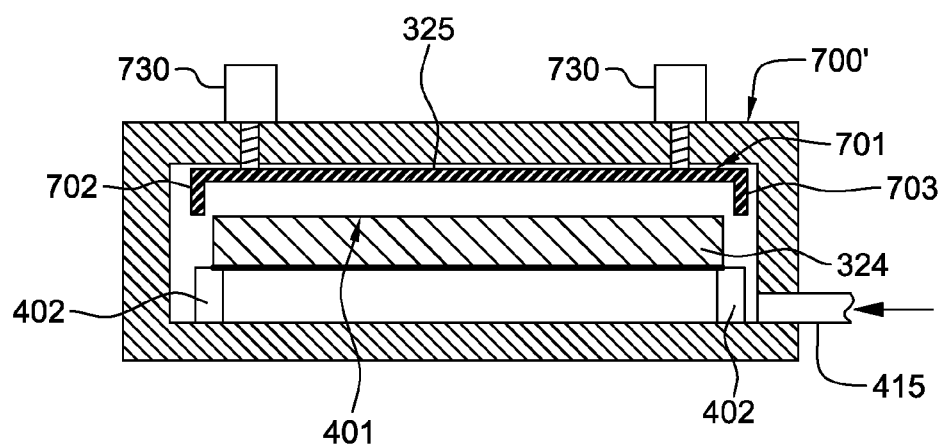
FIG. 7B is a cross-sectional elevational view of an alternate embodiment of an apparatus comprising the protector plate of FIG. 7A, and shown with the protector plate in a raised position relative to the surface of interest of the process structure, in accordance with one or more aspects of the present invention.
Figure 7C:
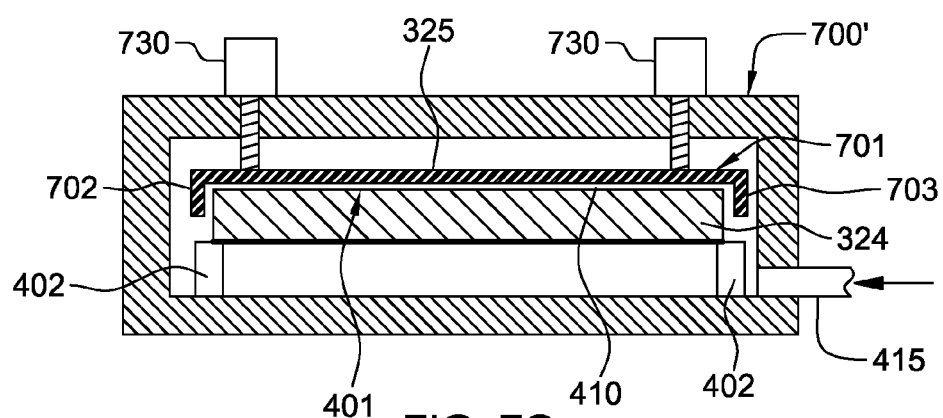
FIG. 7C is a cross-sectional elevational view of the apparatus of FIG. 7B, and illustrating disposition of the protector plate in a lowered position in spaced, opposing relation to the surface of interest of the process structure, in accordance with one or more aspects of the present invention.

In the apparatus embodiment of FIGS. 7B & 7C, support mechanisms 730 are provided which are dynamically adjustable in order to raise or lower the protector frame within the transfer chamber. In FIG. 7B, protector frame 701 is raised up within transfer chamber 320, for example, to facilitate insertion or removal of process structure 324 from the transfer chamber, and then in FIG. 7C, is lowered down into position close to, but spaced from, the process structure, where protector plate 701 is disposed in spaced, opposing relation to the surface 401 of interest to provide the gap therebetween which presents a diffusion barrier to particle migration into the gap and onto the surface. Note that in this embodiment, any dynamically adjustable support mechanism may be employed to raise and lower the protector frame to facilitate transfer of the process structure into and from the chamber.

Figure 8A:
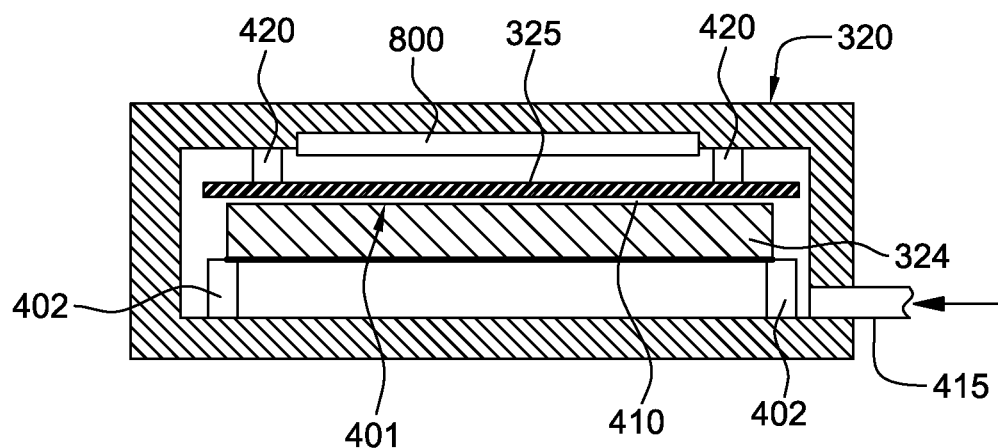
FIG. 8A is a cross-sectional elevational view of another embodiment of an apparatus comprising a protector plate in spaced, opposing relation to a surface of interest of a process structure, in accordance with one or more aspects of the present invention.
Figure 8B:
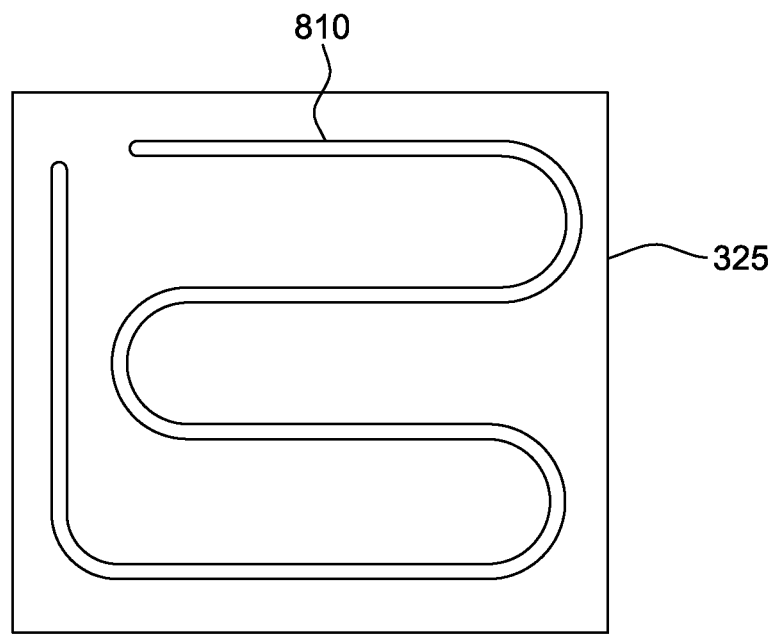
FIG. 8B is a plan view of an alternate embodiment of a protector plate to be supported within a transfer chamber in spaced, opposing relation to a surface of interest, in accordance with one or more aspects of the present invention.

FIG. 8A depicts an apparatus, such as the apparatus of FIG. 4A described above, with the addition of a heat source 800 disposed within the transfer chamber 320. In the illustrated embodiment, heat source 800 is disposed adjacent to, but spaced from, protector plate 325, while in the alternate embodiment of FIG. 8B, an attached heat source 810 is coupled directly to protector plate 325. By providing heat source 800 or attached heat source 810, the radiation of the heated surface of the protector plate will increase the surface temperature of the surface 401 of interest to prevent condensation from occurring on the surface of interest. In addition, thermophoretic forces will further prevent particle contamination from occurring on the surface of interest due to the indirect application of heat to the surface of interest across the protector plate.

As a further enhancement, the protector plate can be fabricated of a contamination-getter material, such as aluminum, which facilitates collecting any molecular contamination that might enter the gap between the protector plate and the surface of interest.

Figure 9A:
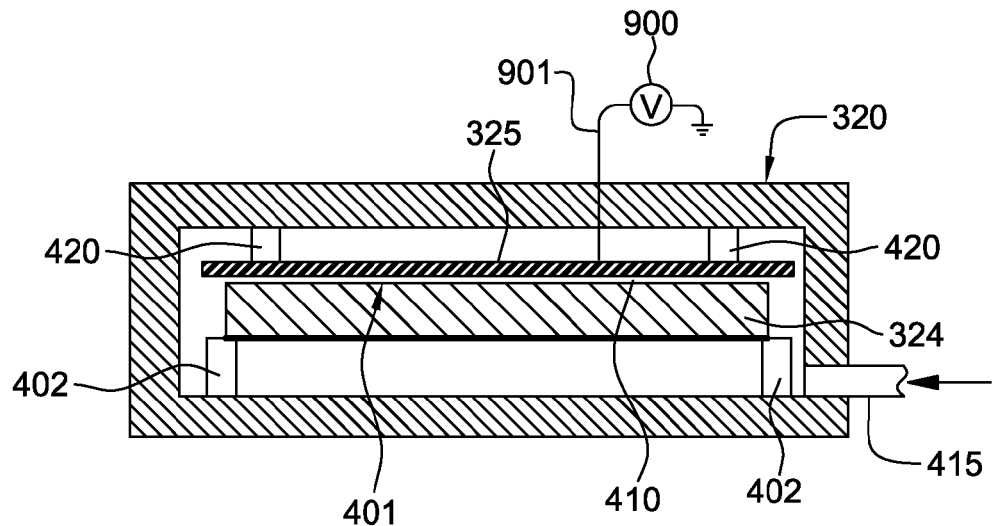
FIG. 9A is a cross-sectional elevational view of another embodiment of an apparatus comprising a protector plate in spaced, opposing relation to a surface of interest, in accordance with one or more aspects of the present invention.

FIG. 9A depicts a further variation of the apparatus, wherein a power source 900 is provided to charge protector plate 325 and thereby create an electrostatic trap from the plate. Alternatively, the protector plate could be coupled to the power source to reduce electrostatic charge in the protector plate should there be any. As illustrated, power source 900 electrically connects 901 to protector plate 325, which in one embodiment, is fabricated of an electrically conductive material, such as a metal.

Figure 9B:
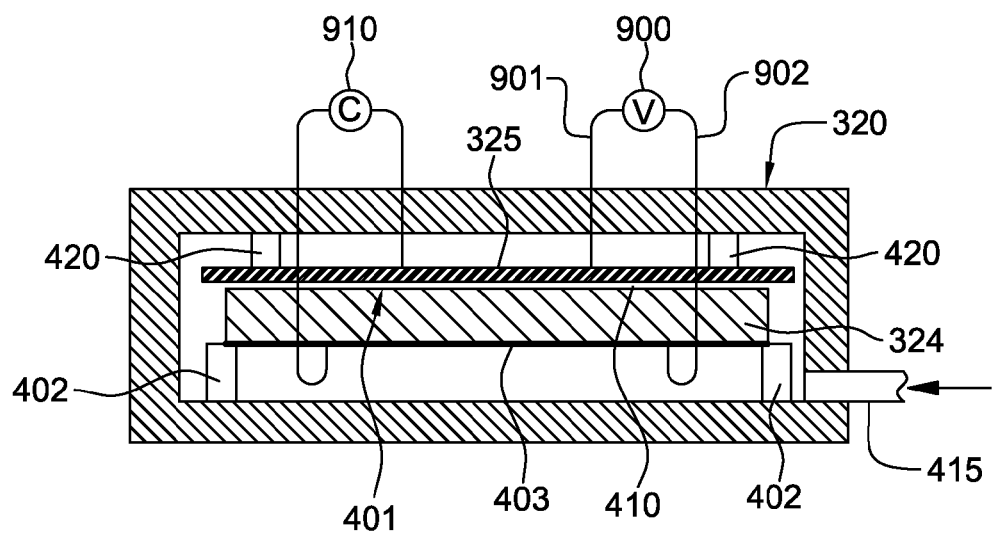
FIG. 9B is a cross-sectional elevational view of another embodiment of an apparatus comprising a protector plate in spaced, opposing relation to a surface of interest, in accordance with one or more aspects of the present invention.

In FIG. 9B, power source 900 is shown also electrically connected 902 to support surface 403 of process structure 324, which in one embodiment, is a metal layer. Electrically conductive support members 402 could be employed in electrically connecting power source 900 to support surface 403 of process structure 324. By electrically coupling power source 900 between protector plate 325 and support surface 403, capacitance 910 can be evaluated between the structures. Using this configuration, any change in capacitance from an anticipated value might provide information about parallelism of the surface of interest relative to the protector plate, as well as an indication of potential moisture being present, or other severe contamination on the surface of interest or the protector plate.

Figure 10:
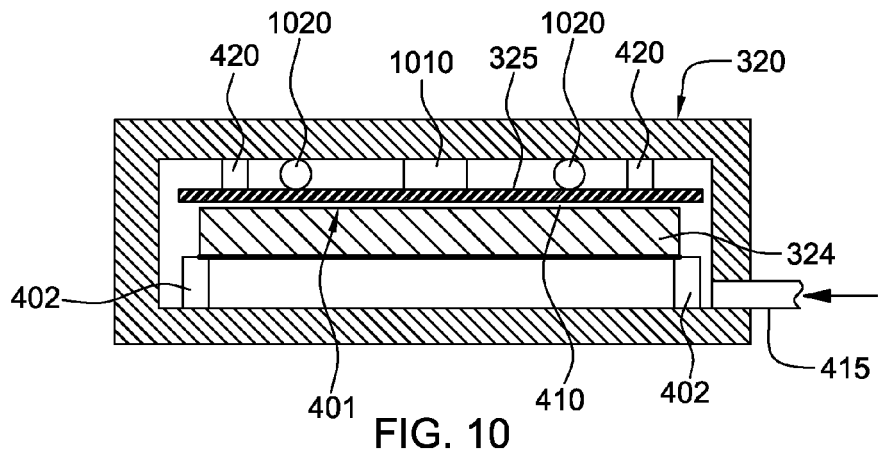
FIG. 10 is a cross-sectional elevational view of another embodiment of an apparatus comprising a protector plate in spaced, opposing relation to a surface of interest, in accordance with one or more aspects of the present invention.

In FIG. 10, the apparatus of FIG. 4A is depicted, with the addition of one or more cooling sources 1000, 1010, coupled to protector plate 325 for creating a cold trap of the protector plate. For example, one or more thermoelectric modules 1000 could be coupled to protector plate 325 to controllably cool the protector plate to a desired temperature. As is know, a thermoelectric module is electrically controllable to transfer thermal energy from a cold side to a hot side of the module using an effect known as the Peltier effect. Alternatively, one or more liquid-cooled structures 1010 could be coupled to protector plate 325. In one example, these liquid-cooled structures could comprise coolant-carrying channels affixed to the back side of protector plate 325.

Figure 11A:
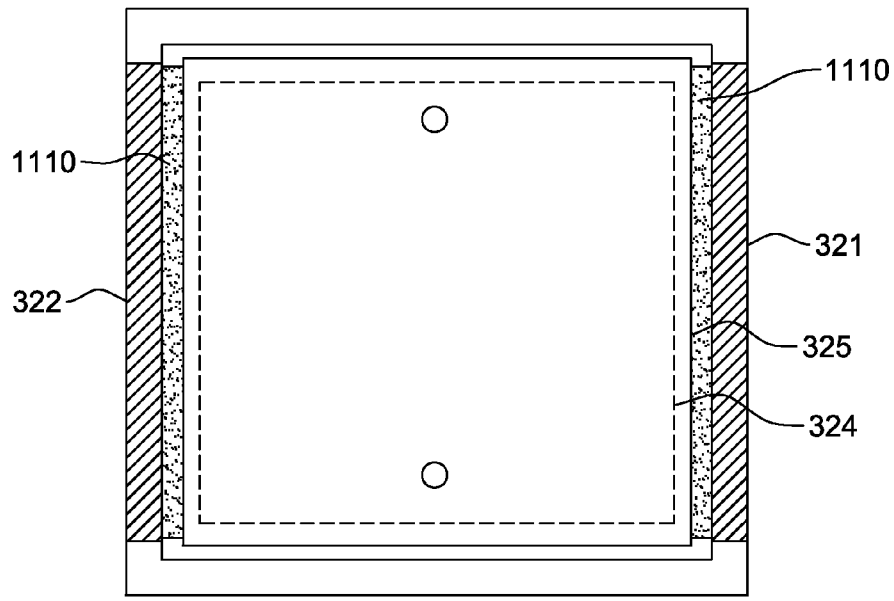
FIG. 11A is a plan view of another embodiment of an apparatus comprising a protector plate in spaced, opposing relation to a surface of interest, in accordance with one or more aspects of the present invention.
Figure 11B:
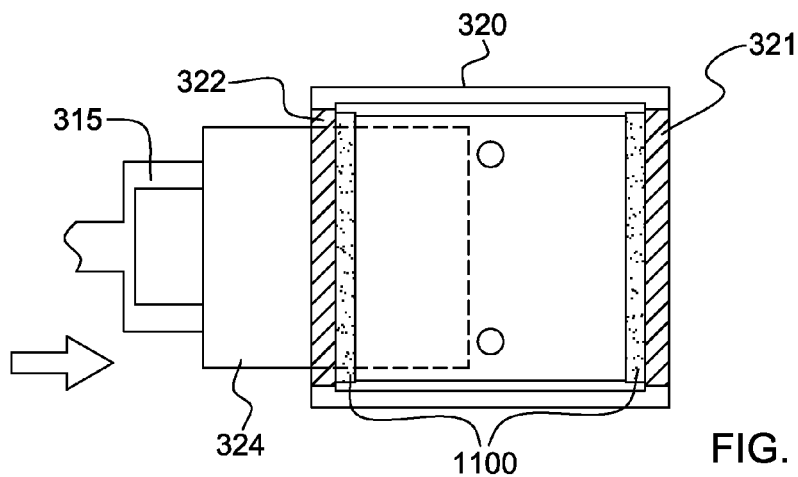
FIG. 11B depicts the apparatus of FIG. 11A, and illustrates application of UV exposure to the surface of interest during loading or unloading of the surface of interest, in accordance with one or more aspects of the present invention.

FIGS. 11A & 11B depict a further variation on the above-described apparatus of FIGS. 3-5C, wherein light sources are added to the transfer chamber adjacent to first gate 321 and second gate 322. These light sources may comprise an ultraviolet (UV) light source or a vacuum UV (VUV), which facilitate breaking any chemical bond between the surface of interest and particle contamination, such as any potential organic (carbon) contamination of the surface of interest. In one implementation, light sources 1100 may be suspended within the transfer chamber in a manner so as to control the distance between the surface of interest and the light source as the surface of interest is inserted into or removed from the transfer chamber. For example, FIG. 11B illustrates removal of the process structure 324 from transfer chamber 320 through second gate 322, employing second end-effector 315. During this removal process, light source 1100 adjacent to second gate 322 could be controlled to provide a desired exposure to the surface of interest. Light sources 1100 may be, for example, a side-on lamp, a head-on lamp, a pen-shaped long lamp, or an array of UV-point source lamps, and may operate with a wavelength of about 140-400 nanometers (nm), at an intensity of about 1 mW/cm$^2$ or higher, such as higher than 5 mW/cm$^2$. Examples of UV source 1100 may include, without limitation, a high-pressure mercury lamp (wavelength of about 250-450 nm), a low-pressure mercury lamp (wavelength of about 180-480 nm), a UV light-emitting and/or laser diode (wavelength of about 300-400 nm), a metal halide lamp (wavelength of about 200-450 nm), an Xe2 excimer lamp (wavelength of about 172 nm), an Ar2 excimer lamp (wavelength of about 146 nm), a KrCl excimer lamp (wavelength of about 222 nm), an XeI excimer lamp (wavelength of about 254 nm), an XeCl excimer lamp (wavelength of about 308 nm), an ArF excimer lamp (wavelength of about 193 nm), a KrF excimer laser (wavelength of about 248 nm), or an F2 laser (wavelength of about 157 nm). Alternatively, the UV source could be provided using frequency conversion crystals and a visible or infrared light. In other embodiments, the light source 1100 may be located outside of the transfer chamber, where light is generated from the source and introduced into the transfer chamber using, for example, an optical fiber. Alternatively, an optical waveguide, a lens, or a reflective mirror, may be used to introduce the light.

Figure 12A:
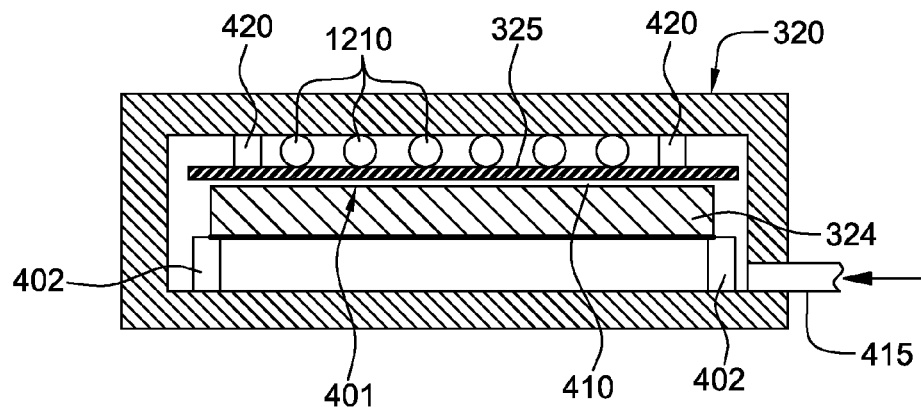
FIG. 12A is a cross-sectional elevational view of another embodiment of an apparatus comprising a protector plate in spaced, opposing relation to a surface of interest, in accordance with one or more aspects of the present invention.
Figure 12B:
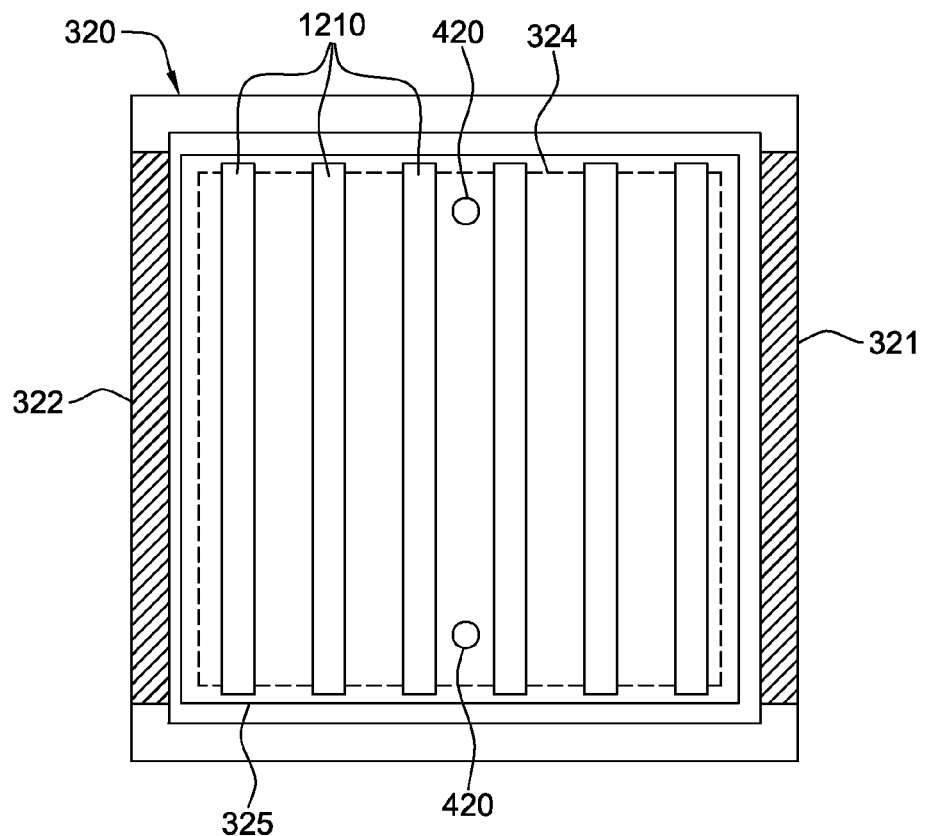
FIG. 12B is a plan view of another embodiment of an apparatus comprising a protector plate in spaced, opposing relation to a surface of interest, and illustrating a plurality of UV sources associated with the protector plate, in accordance with one or more aspects of the present invention.

FIGS. 12A & 12B depict further variations of an apparatus for introducing a light source 1200 (FIG. 12A), 1210 (FIG. 12B), into transfer chamber 320. In these embodiments, the protector plate 325 is made of, for example, quartz, which allows for the provision of continuous UV radiation through the protector plate to the surface of interest during a pressure change cycle to prevent any organic contamination of the surface of interest within the transfer chamber. Note that the number and configuration of light sources 1200, 1210 may be modified without departing from the scope of the present invention. Any of the above-described light sources could be employed within the transfer chamber or external the transfer chamber to introduce continuous UV radiation onto the surface of interest during pressure changing between the atmospheric stage and vacuum stage.

Figure 13A:
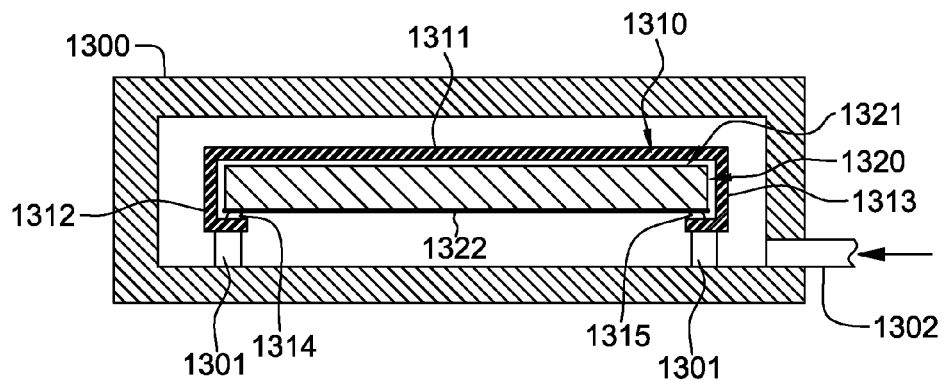
FIG. 13A is a cross-sectional elevational view of another embodiment of an apparatus comprising a protector frame with a protector plate in spaced, opposing relation to a surface of interest, in accordance with one or more aspects of the present invention.
Figure 13B:
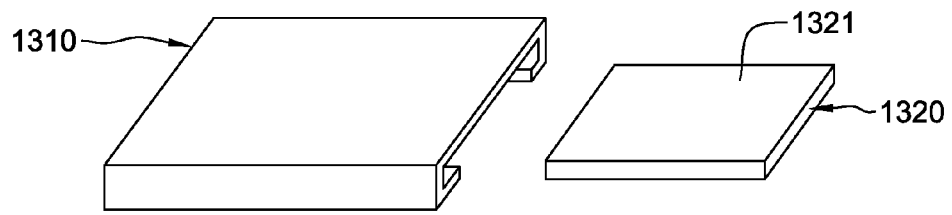
FIG. 13B partially depicts the apparatus of FIG. 13A, and in particular, illustrates in exploded view the protector frame and the process structure comprising the surface of interest to be protected, in accordance with one or more aspects of the present invention.

FIGS. 13A-14C depict an alternate embodiment of an apparatus for inhibiting particle contamination of a surface of interest. In this alternate embodiment, the apparatus is assumed to comprise a transfer chamber disposed between an atmospheric stage and a vacuum stage of a processing environment such as that described above in connection with FIGS. 2 & 3. As illustrated in FIGS. 13A & 13B, the apparatus includes a protector frame 1310 configured to reside within a transfer chamber 1300 with a surface of interest 1321 of a process structure 1320, and to inhibit particle contamination of the surface 1321. Protector frame 1310 includes a protector plate 1311 and at least one first support 1314 and at least one second support 1315, such as spherical-shaped supports, at opposite sides of the protector frame. In the embodiment depicted, the at least one first support 1314 and at least one second support 1315 are associated with a first side wall 1312 and a second side wall 1313, respectively, extending from opposite sides of protector plate 1311 of the protector frame. These first and second side walls are illustrated in FIG. 13A to be substantially L-shaped, with the one or more first supports 1314 and one or more second supports 1315 contacting respective edges of support surface 1322 of process structure 1320. As illustrated, support surface 1322 is an opposite surface of the process structure from surface 1321 of interest. The first and second side walls and supporting structures are sized and configured to support the process structure 1320 in such a manner that the surface 1321 of interest is in spaced, opposing relation to protector plate 1311 to provide a gap between the protector plate and the surface which presents a diffusion barrier to particle migration into the gap and onto the surface, thereby inhibiting particle contamination of the surface. In operation, the protector frame 1310 may be loaded into transfer chamber 1300 onto support members 1301, and positioned within the transfer chamber during loading of the process structure 1320. In this implementation, the protector frame is an open-ended frame structure having a first open end and a second open end at opposite sides of the protector frame, which facilitate insertion of the surface within or removal of the surface from the protector frame. In one embodiment, the surface of interest loads directly into the protector frame after the protector frame is disposed within the transfer chamber.

Figure 14A:
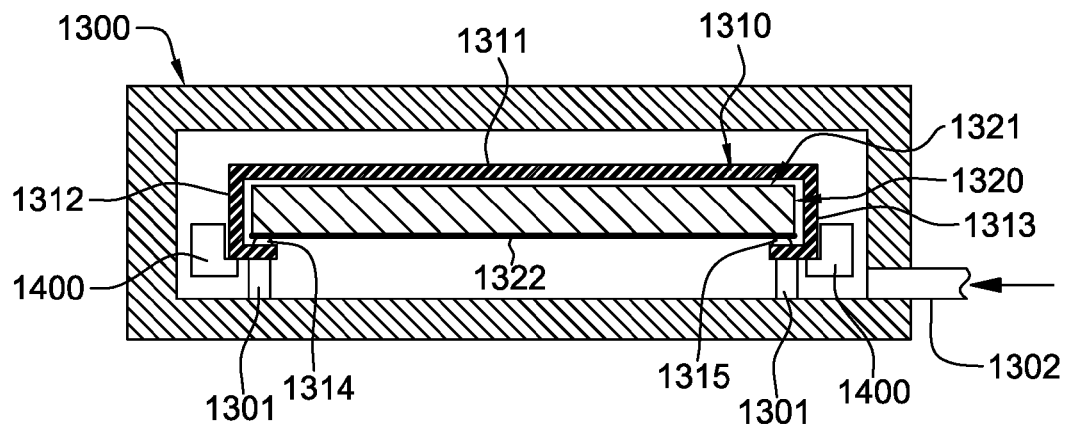
FIG. 14A depicts an alternate embodiment of an apparatus comprising a protector frame with a protector plate in spaced, opposing relation to a surface of interest of a process structure, in accordance with one or more aspects of the present invention.
Figure 14B:
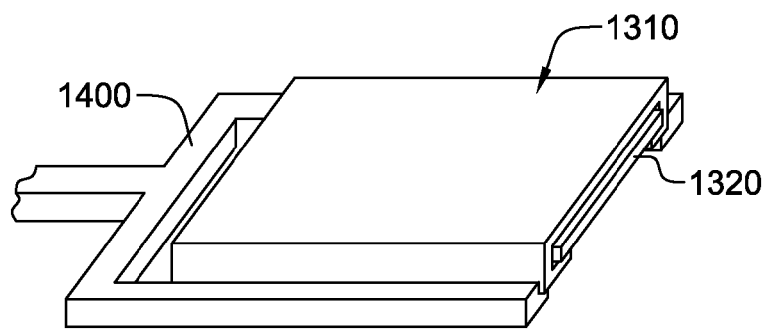
FIG. 14B depicts the protector frame and the process structure of FIG. 14A, shown residing on an end-effector, which facilitates loading (or unloading) of the protector frame and process structure together within (or from) the transfer chamber, in accordance with one or more aspects of the present invention.
Figure 14C:
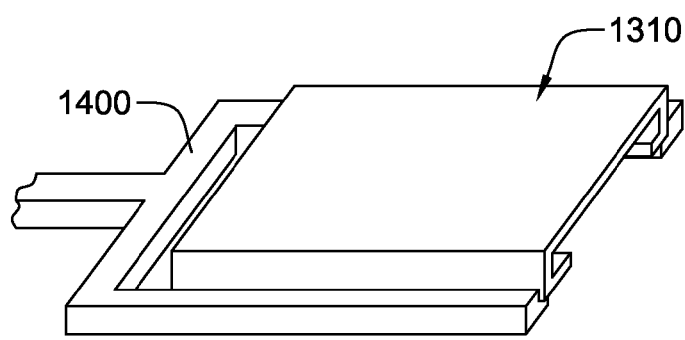
FIG. 14C illustrates the protector frame of FIGS. 14A & 14B residing on an end-effector, which facilitates separate insertion or removal of the protector frame within the transfer chamber, independent of the process structure comprising the surface of interest, in accordance with one or more aspects of the present invention.

After transitioning, for example, from atmospheric pressure to vacuum, the protector plate and process structure could be unloaded as an assembly (as illustrated in FIGS. 14A-14C) employing an end-effector 1400 of the vacuum stage. The process structure 1320 of the assembly (comprising protector frame 1310 and process structure 1320) may then be placed onto a chuck of the vacuum stage, with the protector frame being subsequently removed from the process structure and returned back to the transfer chamber 1300. As illustrated in the figures, end-effector 1400 is configured and sized to engage the protector frame along the first and second side walls of the protector frame, which simultaneously allows for removal of the protector frame and the process structure disposed within the protector plate, while maintaining the surface of interest in spaced, opposing relation with the protector plate of the protector frame for further protecting the surface from particle contamination during the transfer operation from the transfer chamber to, for example, a vacuum tool or atmospheric tool, depending on the direction of transfer.

Advantageously, the structures described above provide a number of benefits compared with, for example, a dual-container approach, such as depicted in FIG. 1. The surface of interest is protected from particle contamination during the pressure change operation, and the protector frame (or plate) remains within the transfer chamber or the vacuum tool. Mechanical handling is minimized, with no need for a complex unloading from a dual-container structure. Further, depending on the implementation, there may be no need for inverting a process structure within the vacuum stage since the process structure can be loaded with the surface of interest facing up. Further, the apparatuses disclosed herein protect the surface of interest with a simpler structure, and no change is required to front end tools of the processing environment, thereby significantly saving costs compared with a dual-container approach.

As used herein, the term "coupled" is defined as connected, although not necessarily directly, and not necessarily mechanically.

Further, as used herein, the terms "a" and "an" are defined as one or more unless this disclosure explicitly requires otherwise.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verb. As a result, a method or device that "comprises", "has", "includes" or "contains" one or more steps or elements possesses those one or more steps or elements, but is not limited to possessing only those one or more elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus comprising:
   a surface to be protected;
   a chamber configured to receive the surface to be protected;
   a protector plate distinct from the chamber and designed to be affixed within the chamber independent of the surface to be protected, the protector plate being fabricated of an electrically conductive material;
   a support mechanism affixing the protector plate to and suspending the protector plate within the chamber in spaced, opposing relation to the surface to be protected without contacting the surface to be protected, and with a gap between the protected plate and the surface that presents a diffusion barrier to particle migration into the gap and onto the surface between the protector plate and the surface due, at least in part, to physical proximity of the protector plate to the surface to be protected, thereby inhibiting particle contamination of the surface, the surface to be protected being insertable or removable from the chamber independent of the protector plate; and
   a power source electrically coupled to the protector plate, the power source electrically charging the protector plate so that the protector plate suspended within the chamber over the surface to be protected is an electrostatic trap;
   wherein the apparatus further comprises a process structure comprising a reticle, a mask, a mask blank, a wafer, a substrate, or a plate, the surface to be protected being a first side of the process structure and wherein the process structure further comprises a conductive material on a support surface thereof, the support surface being a second side of the process structure, the first side and the second side being opposite sides of the process structure, and wherein the power source further electrically couples to the process structure to facilitate evaluating parallelism of the protector plate and the surface to be protected.

2. The apparatus of claim 1, wherein the support mechanism comprises a holding mechanism for holding the protector plate away from an inner surface of the chamber to which the holding mechanism attaches.

3. The apparatus of claim 1, wherein the protector plate extends beyond a periphery of the surface to be protected.

4. The apparatus of claim 3, wherein the support mechanism affixes the protector plate in an upper portion of the chamber, and the surface to be protected is received into the chamber below the protector plate, with the surface to be protected facing upwards to be in spaced, opposing relation with the protector plate.

5. The apparatus of claim 3, wherein the chamber is a transfer chamber which facilitates transitioning of the surface between atmospheric pressure and vacuum, and the protector plate is held at a height over the surface to be protected which establishes the diffusion barrier to particle migration notwithstanding transitioning of the surface between atmospheric pressure and vacuum, and wherein the surface is a surface of a process structure, the process structure comprising one of a reticle, a mask, a mask blank, a wafer, a substrate, or a plate.

* * * * *